United States Patent [19]

Kawamata et al.

[11] Patent Number: 4,786,870
[45] Date of Patent: Nov. 22, 1988

[54] MAGNETIC SENSOR FOR MAGNETICALLY DETECTING THE POSITION OF A MOVABLE BODY

[75] Inventors: Syooichi Kawamata; Tadashi Takahashi; Kunio Miyashita, all of Hitachi, Japan

[73] Assignee: Hitachi, Ltd., Tokyo, Japan

[21] Appl. No.: 916,699

[22] Filed: Oct. 8, 1986

[30] Foreign Application Priority Data

Oct. 9, 1985 [JP] Japan .................. 60-223567

[51] Int. Cl.⁴ .............................. G01B 7/28
[52] U.S. Cl. ................... 324/208; 324/262; 324/252; 338/32 R
[58] Field of Search .......... 324/207, 208, 252, 262; 338/32 R

[56] References Cited

FOREIGN PATENT DOCUMENTS 59-108193 6/1984 Japan .................. 324/202

Primary Examiner—Reinhard J. Eisenzopf
Assistant Examiner—Warren S. Edmonds
Attorney, Agent, or Firm—Antonelli, Terry & Wands

[57] ABSTRACT

A magnetic position detector having a rotary magnetic recording medium which is movable with a movable body the position of which is to be detected. The rotary magnetic recording medium is divided into plural channels, each of which includes two tracks. A magnetic sensor is disposed to face the magnetic recording medium with a predetermined air gap therebetween and includes two sets of magnetoresistive elements spaced by a predetermined distance for each channel. Each set of magnetoresistive elements includes two elements wherein the first elements of the two sets face one of the tracks of a channel and the second elements of the other of the two sets faces the other track and the first and second elements of the two sets are formed as one body with adjacent ends of the first and second elements being coupled with each other. The coupled adjacent ends are connected to either one of first terminals for deriving output voltages from the magnetoresistive elements or to second terminals for supplying the magnetoresistive elements with source voltage. The non-adjacent ends of the first and second elements which are opposite to the coupled ends are connected to the other of the first and second terminals. In this manner, the sensor can be made small in size and the resistivity against noise is enhanced.

14 Claims, 11 Drawing Sheets

FIG. 4
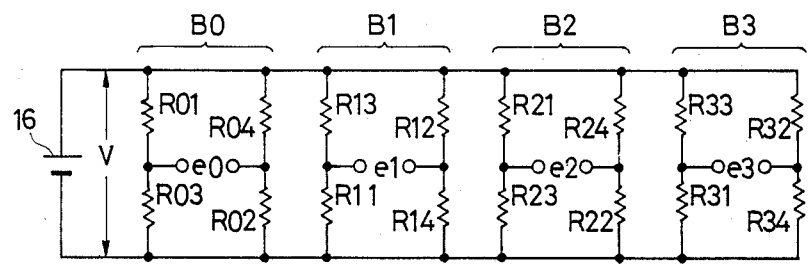
FIG. 5a  e0   
FIG. 5b  e1   
FIG. 5c  e2   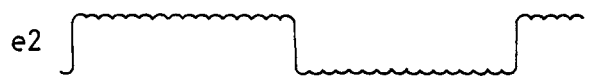
FIG. 5d  e3   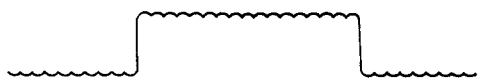
FIG. 6a  E0   
FIG. 6b  E1   
FIG. 6c  E2   
FIG. 6d  E3   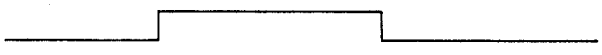

ary ends, which are opposite to the coupled ends of the magnetoresistive elements, being connected to the other terminals.

According to the present invention, in addition to the advantage in decreasing the size of the magnetic sensor, the resistivity against noise is much improved, because the amount of wiring within the magnetic sensor is reduced by the effective and reasonable arrangement and connection of the magnetoresistive elements and wiring conductors.

Other objects, features and advantages of the present invention will become apparent from reading the following description and inspection of the appended drawings.

MAGNETIC SENSOR FOR MAGNETICALLY DETECTING THE POSITION OF A MOVABLE BODY

BACKGROUND OF THE INVENTION

1. Field of The Invention

The present invention relates to an apparatus for magnetically detecting the position of a body having an improved magnetic sensor.

2. Description of The Related Art

The inventors have proposed an apparatus for magnetically detecting the position of a body, as disclosed in the Japanese Patent Laid-open Publication No. 59-108193, which comprises a rotary drum having a magnetic recording medium and a magnetic sensor facing the rotary drum. The magnetic recording medium is divided into plural tracks, on which magnetic signals for position detection are recorded in a predetermined pattern. The magnetic sensor detects the magnetic signals. According to this, there was the advantageous effect in decreasing the size of the rotary drum without the magnetic interference among the magnetic signals recorded on the plural tracks. In the prior art, however, it was not considered to decrease the size of the magnetic sensor. As a result, the insufficiency remains in decreasing the size of the position detecting apparatus as a whole.

SUMMARY OF THE INVENTION

It is an object of the present invention to provide an apparatus for detecting the position of a body, which is decreased in the size thereof by an improved magnetic sensor, in which sensor the number of conductors and terminals arranged on a base plate of the magnetic sensor is reduced as small as possible.

A feature of the present invention is in that, in an apparatus for magnetically detecting the position of a body, which comprises a magnetic recording medium provided on either one of a moving body and a fixed body facing the moving body with a predetermined air gap and having a plurality of channels elongated in the direction of the movement of the moving body with magnetic signals recorded therealong and a magnetic sensor provided on the other body and having magnetoresistive elements arranged to face the channels of the magnetic recording medium, each channel of the magnetic recording medium is composed of a pair of tracks, in which the magnetic signals recorded on one of the pair of the tracks is shifted by a predetermined length from those recorded on the other track. For each channel of the magnetic recording medium, there are provided on the magnetic sensor two sets of magnetoresistive elements spaced by a predetermined distance from each other, each set being formed by two elements. First elements of both the sets of magnetoresistive elements facing one of the pair of the tracks and second elements of both the sets of the magnetoresistive elements facing the other track are coupled with each other at adjacent ends thereof respectively, two coupling points of the first and the second sets of the magnetoresistive elements being connected to either terminals of the magnetic sensor for supplying the magnetoresistive elements with source voltage or remaining terminals thereof for deriving output voltages from the magnetoresistive elements, and remaining ends, which

BRIEF DESCRIPTION OF THE DRAWINGS

FIG. 4. is a circuit diagram showing bridge circuits formed by the magnetoresistive elements;

FIGS. 5a to 5d show the waveforms of output voltages of the bridge circuits shown in FIG. 4, when the drum rotates;

FIGS. 6a to 6d show the waveforms of signals obtained by shaping the output voltages shown in FIGS. 5a to 5d;

DESCRIPTION OF THE PREFERRED EMBODIMENTS

Figure 1:
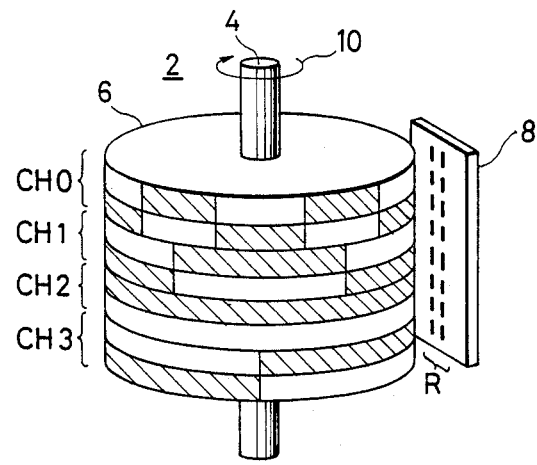
FIG. 1 is a schematic diagram showing an apparatus for magnetically detecting the position of a body, to which the present invention is applied.

Referring at first to FIG. 1, the description will be made of the whole structure of an apparatus for magnetically detecting the position of a body (called a magnetic position detector, hereinafter) according to an embodiment of the present invention.

In the figure, a magnetic position detector generally denoted by reference numeral 2 is formed by a rotary part composed of a shaft 4 and a rotary drum 6 fixed to and rotating with the shaft 4 and a magnetic sensor 8 facing the drum 6 with a predetermined air gap. The rotary part is rotated with the movement of a moving body, the position of which is to be detected, as shown by an arrow 10, and the magnetic sensor 8 is attached to a fixed body positioned in relation to the moving body, so that the position of the moving body with respect to the fixed body can be detected by an output signal of the magnetic sensor 8.

The peripheral surface of the side of the drum 6 is provided with magnetic material and serves as a magnetic recording portion. The recording portion is divided into plural channels, which are elongated in the peripheral direction of the drum 6 and along which magnetic signals are recorded. In the case shown, it is divided into four channels CH0, CH1, CH2 and CH3. The respective channels CH0, CH1, CH2 and CH3 are partially and selectively magnetized, as shown by hatched portions in the figure, and the thus magnetized portions serve as the magnetic signals. In the magnetic sensor 8, there are provided magnetoresistive elements R facing the channels CH0, CH1, CH2 and CH3. The magnetoresistive element is an element which varies its electrical resistance value in response to the intensity of magnetic field applied thereto.

Figure 2:
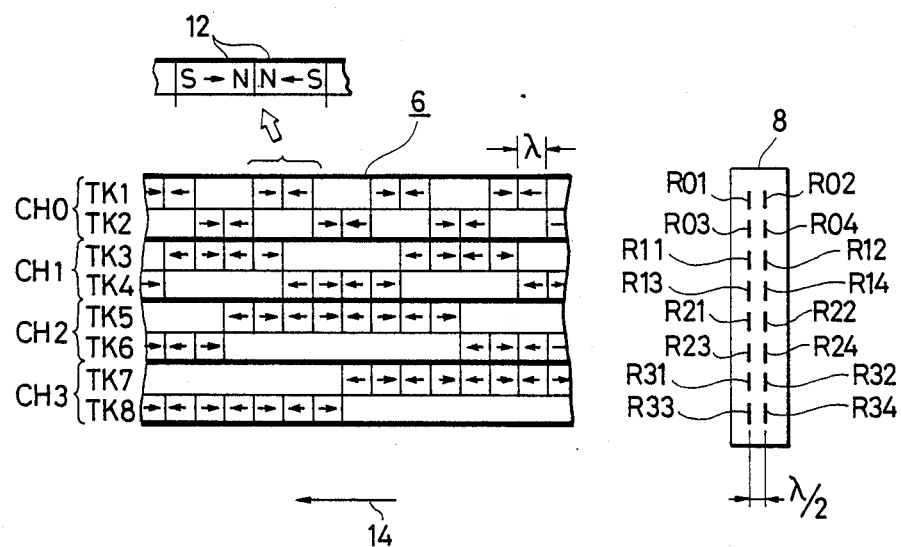
FIG. 2 shows the development of magnetic signals recorded on a drum and the arrangement of magnetoresistive elements on a magnetic sensor facing the drum, the drum and the magnetic sensor being utilized in the apparatus of FIG. 1.

FIG. 2 is a drawing showing the development of the rotary drum 6 and the arrangement of the magnetoresistive elements on the magnetic sensor 8. As apparent from the figure, the channels CH0, CH1, CH2 and CH3 are composed of a pair of tracks TK1 and TK2, TK3 and TK4, TK5 and TK6, and TK7 and TK8, respectively. On the respective tracks, the magnetic signals are recorded by the given combination of magnetization units 12, each of which has the length $\lambda$ (called a pitch, hereinafter). In the figure, small arrows attached to the respective magnetization units 12 indicate the direction of the magnetization. Further, in the respective channels, the magnetic signals are recorded on both of the pair of the tracks with the same pitch ($n\lambda$), however the magnetic signals recorded on one track is shifted by the distance equal to the signal pitch $n\lambda$ from those on the other track.

In the case shown, on the track TK1 of the channel CH0 are alternatingly arranged a magnetized portion consisting of two consecutive magnetization units 12 and a non-magnetized portion having the same pitch ($2\lambda$) throughout the whole periphery of the track TK1. The given combination of those magnetized portions and the non-magnetized portions form the magnetic signals to be recorded on the track TK1. Therefore, the pitch of the signals recorded on this track becomes $2\lambda$. On the track TK2 of the same channel, the magnetic signals are recorded in the same manner as on the track TK1, but they are shifted by $2\lambda$ from the magnetic signals on the track TK1. Therefore, the magnetized portion of the track TK2 corresponds in location to the non-magnetized portion of the track TK1, and vice versa.

On the track TK3 of the channel CH1 are alternatingly arranged a magnetized portion consisting of four consecutive magnetization units 12 and a non-magnetized portion having the same pitch ($4\lambda$) throughout the whole periphery of the track TK3. Therefore, the pitch of the signals recorded on this track is $4\lambda$. On the track TK4 of the same channel, the magnetic signals are recorded in the same manner as on the track TK3, but their phase differs by $4\lambda$ from the magnetic signals on the track TK3.

Also on the tracks TK5 to TK8 of the channels CH2 and CH3, the magnetic signals are recorded in the same manner as on the tracks TK1 to TK4, however the number of the magnetization units 12 consecutively provided thereon is different and amounts to eight in the tracks TK5 to TK8. Further, the magnetic signals recorded on the track TK7 are shifted by $4\lambda$ from those recorded on the track TK5. The same relation is applied to the magnetic signals recorded on the tracks TK6 and TK8.

The magnetic sensor 8 is provided with magnetoresistive elements R01 to R04, R11 to R14, R21 to R24 and R31 to R34 arranged as shown in the figure, each group of which corresponds to the channels CH0 to CH3, respectively. A first set of the elements R01, R03, R11, R13, R21, R23, R31 and R33 thereamong are arranged in a row crossing the direction of the movement of the drum 6 as shown by an arrow 14. A second set of the elements R02, R04, R12, R14, R22, R24, R32 and R34 are also arranged in the same manner. The two sets of the magnetoresistive elements are by $\lambda/2$ apart from each other.

By the way, in the magnetic sensor 8 shown in FIG. 2, the magnetoresistive elements R01 to R34 are brought into two straight lines parallel with each other. However, the manner of arranging the elements R01 to R34 depends on the magnetic signals recorded on the drum 6. If the magnetization in the channel CH0, i.e., on the tracks TK1 and TK2, is shifted by the pitch $n\lambda$ to the left, for example, the elements R01 to R04 facing the tracks TK1 and TK2 must be shifted by n to the left. Even such a magnetic sensor is functionally equivalent to the magnetic sensor 8 as shown in FIG. 2, because the magnetization of the tracks and the magnetoresistive elements corresponding thereto are shifted equally and hence the relationship of the relative position between both does not change at all from that as shown in FIG. 2.

Figure 3:
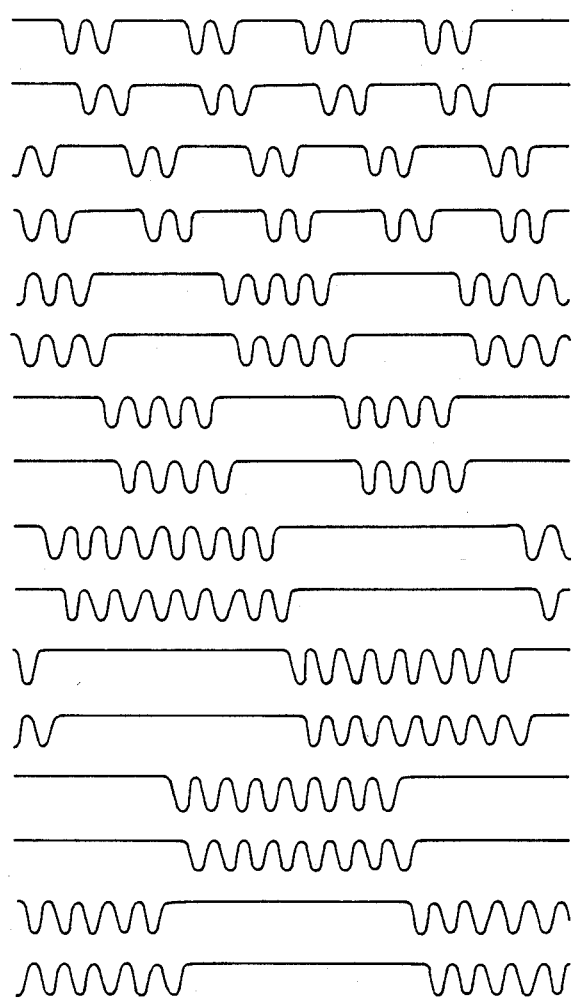
FIG. 3 is a diagram showing the change in the electrical resistance of the magnetoresistive elements, which occures when the drum rotates.

With the structure described above, when the drum 6 rotates in the direction indicated by the arrow 14, the electrical resistance values of the magnetoresistive elements R01 to R34 varies as shown in FIGS. 3(a) to (p) in response to the magnetic field applied thereto, which depends on the pattern of the magnetic signals recorded on the corresponding tracks TK1 to TK8. The elements R01 to R34 form four bridge circuits B0 to B3 corresponding to the channels CH0 to CH3 respectively, as shown in FIG. 4. Therefore, when the voltage V is applied by a source 16 to the bridge circuits B0 to B3, output voltages e0 to e3 appear across respective output terminals of the bridge circuits B0 to B3 due to the variation in the electrical resistance values of the elements R01 to R34.

From the output voltages e0 to e3 as shown in FIGS. 5a to 5d, signals E0 to E3 of the rectangular waveform as shown in FIGS. 6a to 6d are obtained by the known waveform shaping technique. The signals E0 to E3 constitute the values of respective digits of a digital position detecting signal of four bits, i.e., in this case, E0 corresponds to the least significant digit (LSD) of the four-bit signal and E3 to the most significant digit (MSD) thereof. When a position detecting signal of four bits is applied, as in this case, a position which equally divides one revolution of the drum 6 into sixteen can be detected in the form of a digital signal indicative of an absolute position of the drum 6.

Further, the signals shown in FIGS. 6a to 6d are formed in accordance with the so called gray code system. It is of course that other code systems such as a binary code system can be employed. To this end, the pattern of the magnetic signals recorded on the drum 6 has to be altered in accordance with the code system adopted. Also the number of bits of the position detecting signal has no particular limitation and can be selected as needed.

Figure 7:
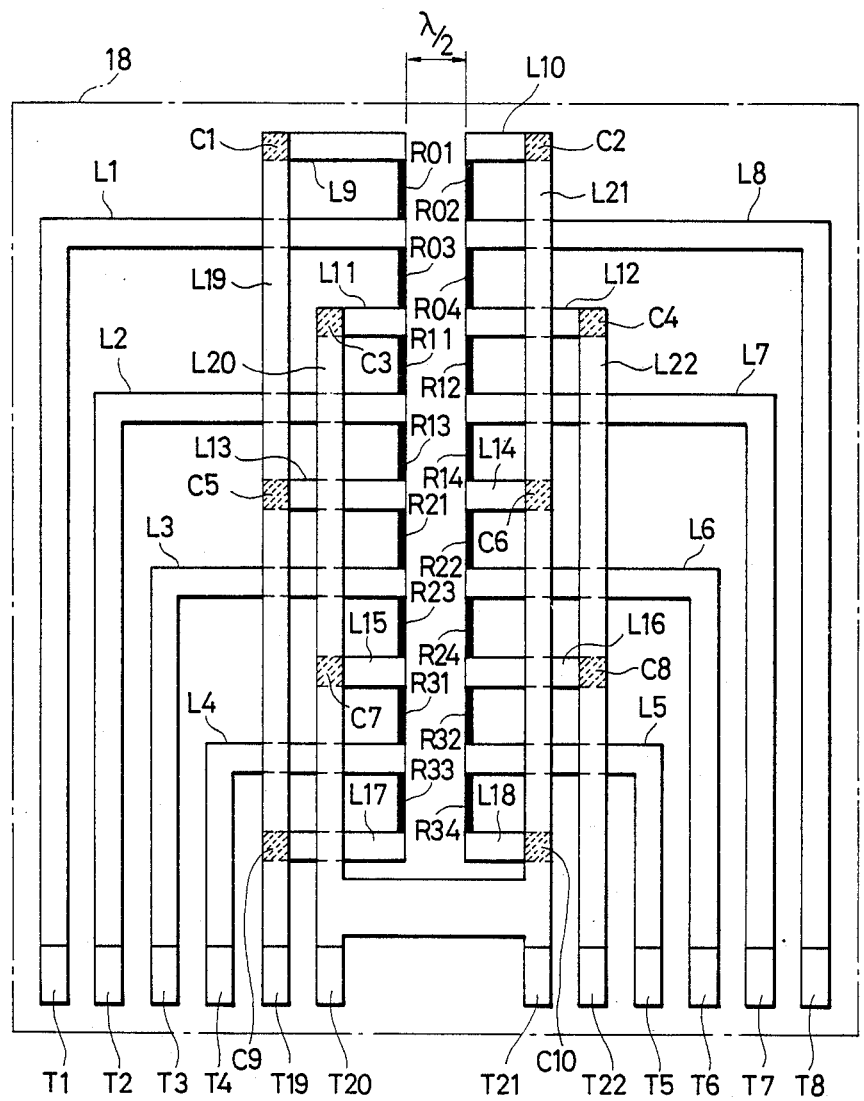
FIG. 7 schematically shows the arrangement of the magnetoresistive elements and the connection of conductors on a magnetic sensor of a position detecting apparatus according to an embodiment of the present invention.

In the following, the description will be made of the further detailed structure of the magnetic sensor 8. FIG. 7 shows the arrangement and connection of the magnetoresistive elements and the wiring. The magnetoresistive elements R01 to R34, which are made of magnetic material such as Permalloy, are arranged on a base plate 18 made of glass by the vapor deposition. Wiring conductors L1 to L22 made, for example, of chromium are also provided on the base plate 18 by the vapor deposition. Further, in the figure, T1 to T8 and T19 to T22 indicate terminals connecting the elements R01 to R34 with an external circuit, and points indicated by reference symbols of the combination of a capital letter C and a numeral represent coupling points at which two wiring conductors are coupled to each other.

Figure 8:
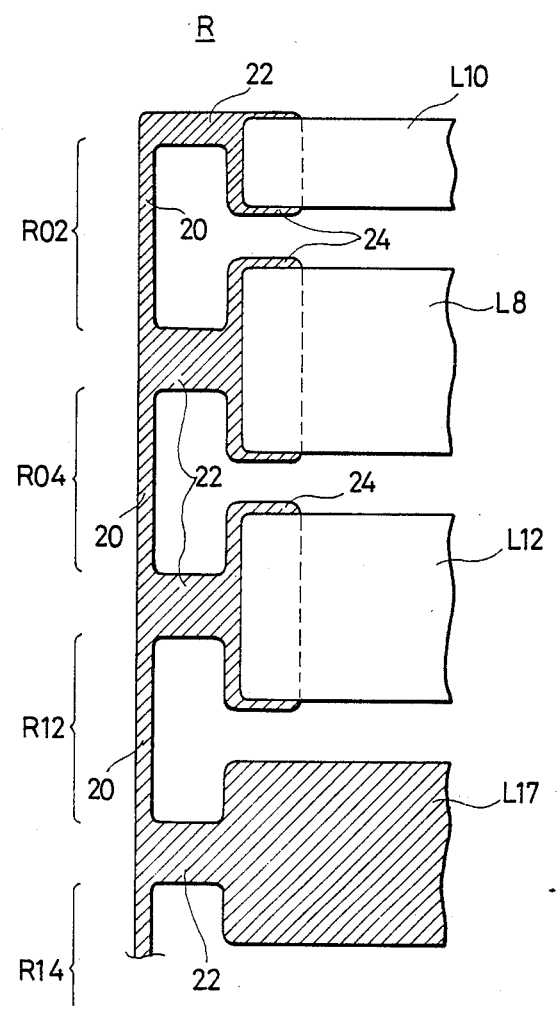
FIG. 8 is an explanatory drawing showing examples of the connection of the magnetoresistive elements and the conductors.

Although only a part of the magnetoresistive elements is shown in FIG. 8, the magnetoresistive elements R01 to R34 are formed as one body for the respective one of the two sets of the elements, i.e., the first set consisting of R01, R03, R11, R13, R21, R23, R31 and R33, and the second set of R02, R04, R12, R14, R22, R24, R32, and R34.

A magnetoresistive element body (a hatched portion) generally denoted by reference symbol R is made of Permalloy as a whole and comprises a long and slender portion 20, lead portions 22 projected from the slender portion 20 at the predetermined interval and terminal portions 24 provided at one ends of the lead portions 22 for connecting the wiring conductors L10, L8, L12. The slender portion 20 is functionally divided into plural segments by the lead portions 22; eight segments in the embodiment of FIG. 7. Each segment functions as the element R01, R03, R11, R13, R21, R23, R31 or R33 in the first set of the magnetoresistive elements, or as the element R02, R04, R12, R14, R22, R24, R32 or R34 in the second set of the magnetoresistive elements. Further, although, in the foregoing description, the wiring conductors L10, L8, L12 are connected to the respective terminal portions 24, the terminal portion 24 can be extended to function as a part of the wiring conductors as shown by an example of the wiring conductor L17 in FIG. 8.

Figure 9A:
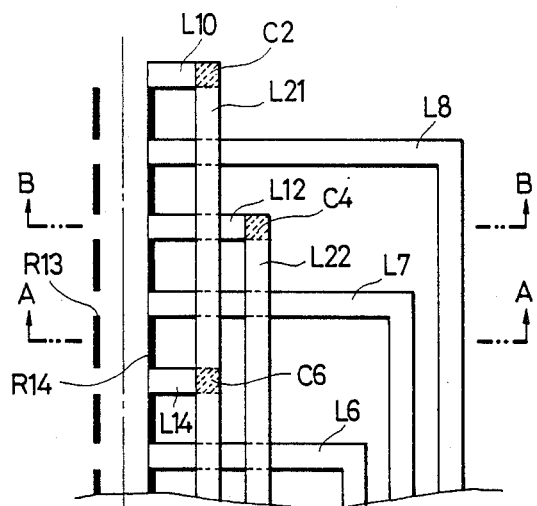
FIGS. 9a to 9c are drawings for explaining the sectional structure of the magnetic sensor shown in FIG. 7.
Figure 9B:
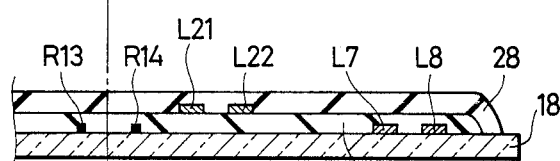
Figure 9C:
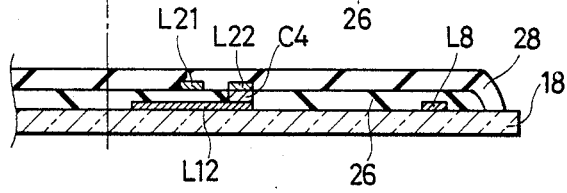

In FIGS. 9a to 9c, the sectional structure of the magnetic sensor 8 is shown. FIGS. 9b and 9c are sectional views of the magnetic sensor 8 sectioned along section lines A—A and B—B in FIG. 9a, respectively.

As apparent from these figures, on the base plate 18 there are provided the magnetoresistive elements R01 to R34 and the wiring conductors L1 to L18 connected to the associated elements R01 to R34. These constitute a first wiring layer, which is covered by insulating material (a first insulation layer) 26 such as silicon dioxide. On the first insulation layer 26 there are further arranged the wiring conductors L19 to L22, which constitute a second wiring layer. The second wiring layer is also covered by insulating material (a second insulation layer) 28 such as silicon dioxide. As shown by an example of the coupling point C4 in FIG. 9c, at the coupling points C1 to C10 of the wiring conductors, the corresponding part of the first insulation layer 26 is scraped off and the conductor of the first wiring layer and that of the second wiring layer are coupled electrically. Further, the magnetic sensor 8 faces the drum 6 on the side of the second insulation layer 28.

Returning again to FIG. 7, the arrangement and connection of the magnetoresistive elements R01 to R34 and the wiring conductors L1 to L22 will be explained. The element R01 facing the track TK1 of the channel CH0 and the element R03 facing the track TK2 of the same channel, both belonging to the first set of the magnetoresistive elements, are arranged on the base plate 18 and structurally coupled with each other at adjacent ends thereof, as illustrated in FIG. 8. Another end of the element R01, which is opposite to the coupled end thereof, is connected to the conductor L9 of the first wiring layer, which is further coupled to the conductor L19 of the second wiring layer at the coupling point C1. The conductor L19 is led to the terminal T19, to which the positive side of the source 16 is coupled. Another end of the element R03, which is opposite to the coupled end thereof, is connected to the conductor L11 of the first wiring layer, which is further coupled to the conductor L20 of the second wiring layer at the coupling point C3. The conductor L20 is led to the terminal T20, to which the negative side of the source 16 is coupled.

In the same manner, the element R02 facing the track TK1 together with the element R01 and the element R04 facing the track TK2 together with the element R03, which belong to the second set of the magnetoresistive elements, are provided on the base plate 18 by λ/2 apart from the elements R01 and R03 and structurally coupled with each other at adjacent ends thereof. Another end of the element R02, which is opposite to the coupled end thereof, is connected to the conductor L10 of the first wiring layer, which is further coupled to the conductor L21 of the second wiring layer at the coupling point C2. The conductor L21 is led to the terminal T21, which is coupled in common with the terminal T20 to the negative side of the source 16. Another end of the element R04, which is opposite to the coupled end thereof, is connected to the conductor L12 of the first wiring layer, which is further coupled to the conductor L22 of the second wiring layer at the coupling point C4. The conductor 22 is led to the terminal T22, to which the positive side of the source 16 is coupled.

Since the terminals T19 and T22 are connected in common to the positive side of the source 16, the magnetoresistive elements R01 to R04 form the bridge circuit B0 shown in FIG. 4. The coupling points of the structurally coupled elements R01 and R03, and R02 and R04 are connected to the terminals T1 and T8 through the conductors L1 and L8 provided in the first wiring layer, respectively. These terminals T1 and T8 serve as output terminals of the bridge circuit B0. The output voltage e0 of the circuit B0 appears across the terminals T1 and T8.

As will be understood from the detailed review of the connection pattern of FIG. 7, the same as described above of the magnetoresistive elements R01 to R04 is applied to the arrangement of the elements R11 to R14 facing the tracks TK3 and TK4 of the channel CH1 and the wiring conductors associated therewith. These elements R11 to R14 form the bridge circuit B1 shown in FIG. 4, and the output voltage e1 appears across the terminals T2 and T7. Similarly, the elements R21 to R24 form the bridge circuit B2 and the output voltage e2 appears across the terminals T3 and T6. The elements R31 to R34 form the bridge circuit B3 and the output voltage e3 appears across the terminals T4 and T5. It is to be noted that the conductors L11 and L12, L13 and L14, and L15 and L16 are selectively coupled to the conductors L19, L20, L21 and L22 and employed in common for supplying the adjacent bridge circuits with soure voltage. Further, the conductors L19 to L22 and the terminals T19 to T22 associated therewith are arranged inside the conductors L1 to L8 for deriving the output voltages from the magnetoresistive elements R01 to R34 and the terminals T1 to T8 associated therewith, when viewed from the side of the magnetoresistive elements.

With the arrangement described above, the number of the conductors and the associated terminals can be reduced and hence the magnetic sensor can be made small in size. Further, any conductors for deriving the output voltages, i.e., L1 to L8, do not cross with one another, so that the output voltages of the bridge circuits B0 to B3 do not interfere with one another and therefore the resistivity against noise caused by any other bridge circuit is much enhanced.

Figure 10:
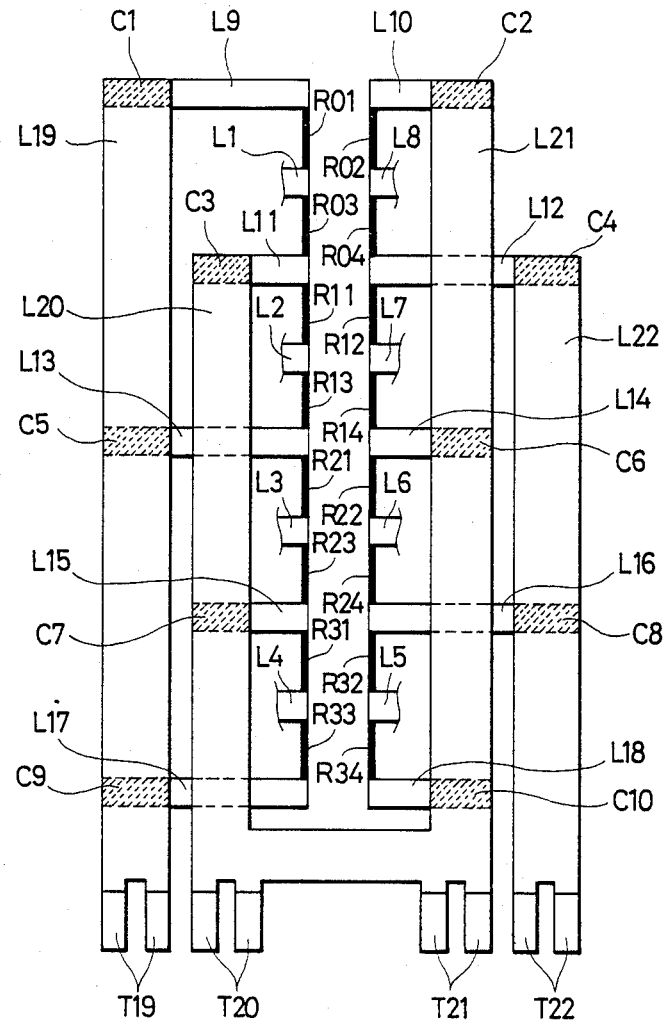
FIG. 10 is a schematic diagram showing a part of a modification of the connection of the conductors, especially of the conductors for supplying the magnetoresistive elements with source voltage, shown in FIG. 7.

By the way, it is desirable that the electrical resistance of the wiring for supplying the magnetoresistive elements R01 to R34 with the source voltage is as low as possible so that the output voltages e0 to e3 of the bridge circuits B0 to B3 become as large as possible. An example of the arrangement of the wiring conductors suited therefor is shown in FIG. 10, in which the same reference symbols indicate the same parts as in FIG. 7. To facilitate matters, only the conductors L9 to L22 for voltage supply are shown and the conductors for deriving the output voltages from the magnetoresistive elements are omitted. Further, since the connection of the elements R01 to R34 and the conductors L9 to L22 is quite the same as that in FIG. 7, the further description thereof is also omitted here. As apparent from the figure, the conductors L19 to L22 are very wide, compared with those in FIG. 7. Therefore, the electrical resistance of the wiring for voltage supply can be reduced remarkably.

Figure 11:
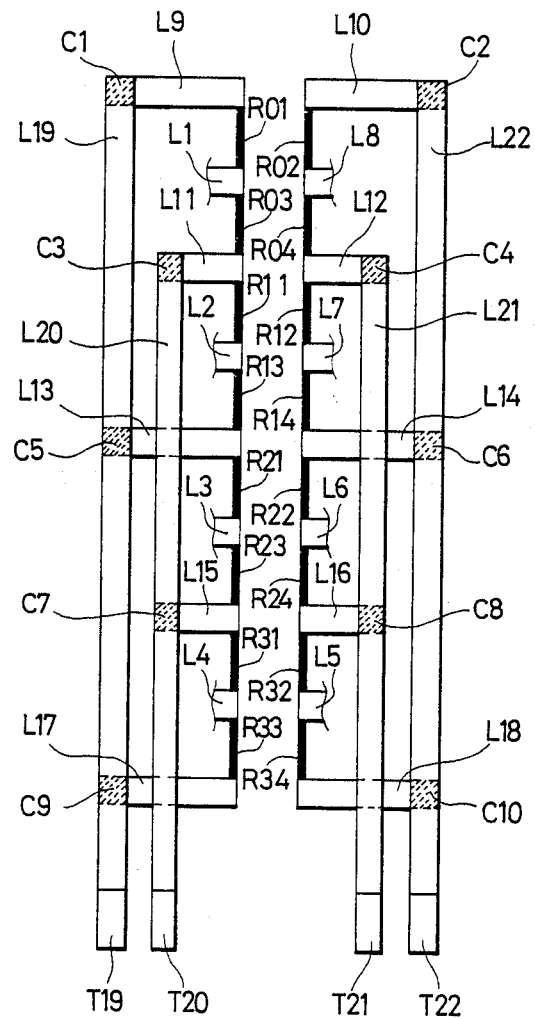
FIG. 11 is a schematic diagram showing a part of another modification of the connection of the conductors, especially of the conductors for supplying the magnetoresistive elements with source voltage, shown in FIG. 7.

FIG. 11 shows another example of the arrangement and connection of the magnetoresistive elements R01 to R34 and the conductors L9 to L22 for voltage supply. The same reference symbols in this figure indicate the same parts as in FIG. 7. Also in this example, the arrangement and connection of the conductors L1 to L8 for deriving the output voltages from the magnetoresistive elements R01 to R34 are the same as in FIG. 7, although they are not shown in this figure. According to this arrangement and connection of the conductors L9 to L22, the terminals T19 to T22 for voltage supply are so arranged that the terminals T19 and T21 to be coupled to the positive electrode of the source 16 and the terminals T20 and T22 to be coupled to the negative electrode thereof alternate regularly. As a result, the polarities of the terminals are scarcely confused and the erroneous wiring can be prevented.

Figure 12:
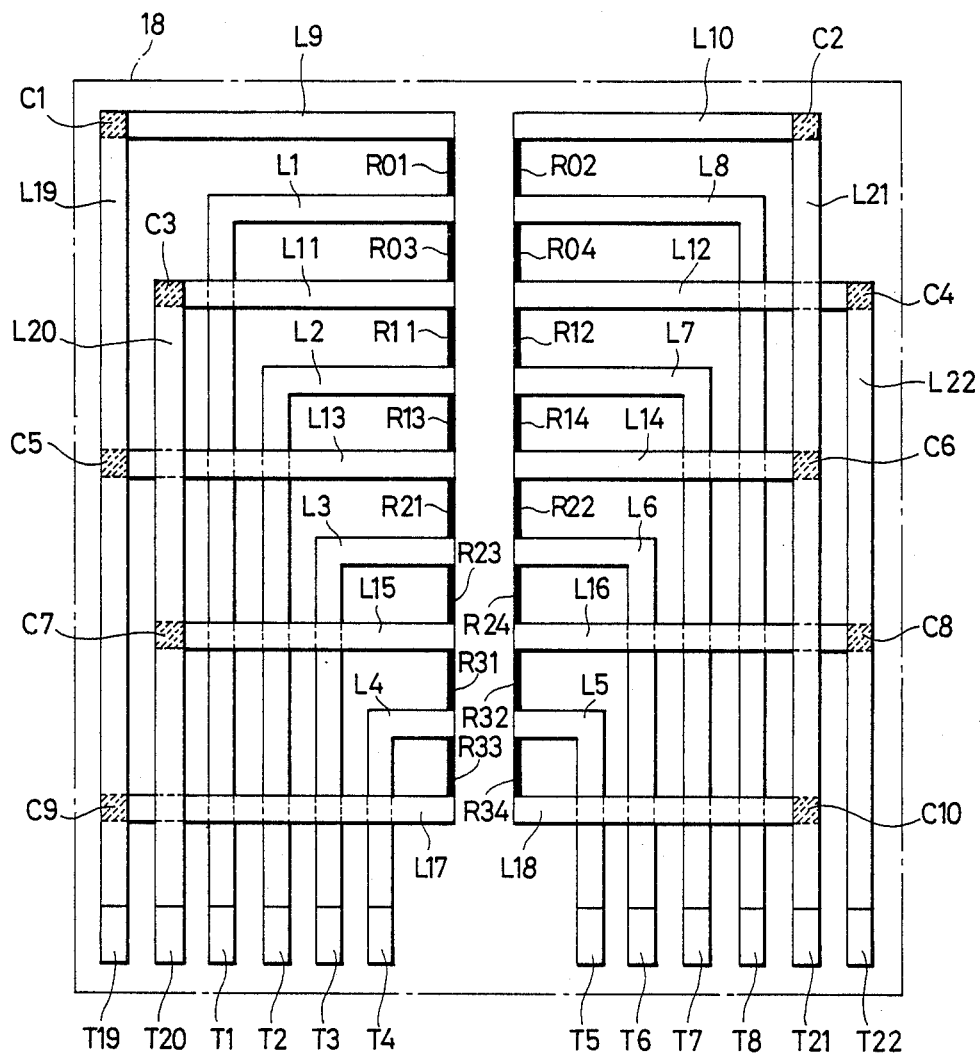
FIG. 12 schematically shows the arrangement of the magnetoresistive elements and the connection of conductors on a magnetic sensor of a position detecting apparatus according to another embodiment of the present invention.

FIG. 12 shows the arrangement and connection of the magnetoresistive elements and the wiring conductors according to another embodiment of the present invention. The same reference symbols indicate the same parts as in FIG. 7. The elements R01 to R34 are formed in the same manner as shown in FIG. 8. The element R01 facing the track TK1 of the channel CH0 and the element R03 facing the track TK2 of the same channel, which belong to the first set of the magnetoresistive elements, are structurally coupled with each other at adjacent ends thereof and further connected to the terminal T1 through the conductor L1. To another end of the element R01, which is opposite to the coupled end thereof, is connected the conductor L9 which is extended to the outside of the conductor L1, when viewed from the side of the magnetoresistive elements. The conductor L9 is connected to the conductor L19 at the coupling point C1 and led to the terminal T19, to which the positive voltage is applied from the source 16. Another end of the element R03, which is opposite to the coupled end thereof, is connected to the conductor L11, which is also extended to the outside of the conductor L1. The conductor L11 is connected to the conductor L20 at the coupling point C3 and led to the terminal T20, which is connected to the negative terminal of the source 16.

The element R02 facing the track TK1 and the element R04 facing the track TK2, which belong to the second set of the magnetoresistive elements, are also structurally coupled with each other at adjacent ends thereof and further connected to the terminal T8 through the conductor L8. Another end of the element R02, which is opposite to the coupled end thereof, is connected to the conductor L10, which is extended to the outside of the conductor L8, when viewed from the side of the magnetoresistive elements. The conductor L10 is connected to the conductor L21 at the coupling point C2 and led to the terminal T21, to which the negative voltage is applied by the source 16. To another end of the element R04, which is opposite to the coupled end thereof, is connected the conductor L12 which is also extended to the outside of the conductor L8. The conductor L12 is connected to the conductor L22 at the coupling point C4 and led to the terminal T22 which is connected to the positive terminal of the source 16.

The magnetoresistive elements R01 to R04 form the bridge circuit B0 shown in FIG. 4 and the terminals T1 and T8 serve as the output terminals of the bridge circuit B0, across which the output voltage e0 appears. As will be understood from the arrangement and connection of FIG. 12, the magnetoresistive elements R11 to R14, R21 to R24 and R31 to R34 are arranged and connected in the same manner as described above and form the bridge circuits B1 to B3, which produce the output voltages e1 to e3, respectively. It is to be noted that, in the structure of FIG. 12, the terminals T1 to T22 for voltage supply (and therefore the conductors L19 to L22, too) are positioned outside the terminals T1 to T8 for deriving the output voltages from the bridge circuits (and therefore the conductors L1 to L8, too). Namely, the conductors for voltage supply are provided as outermost wiring of the arrangement of the magnetic sensor 8. Accordingly, it is possible to prevent external noise from entering the conductors L1 to L8 and the terminals T1 to T8.

Figure 13:
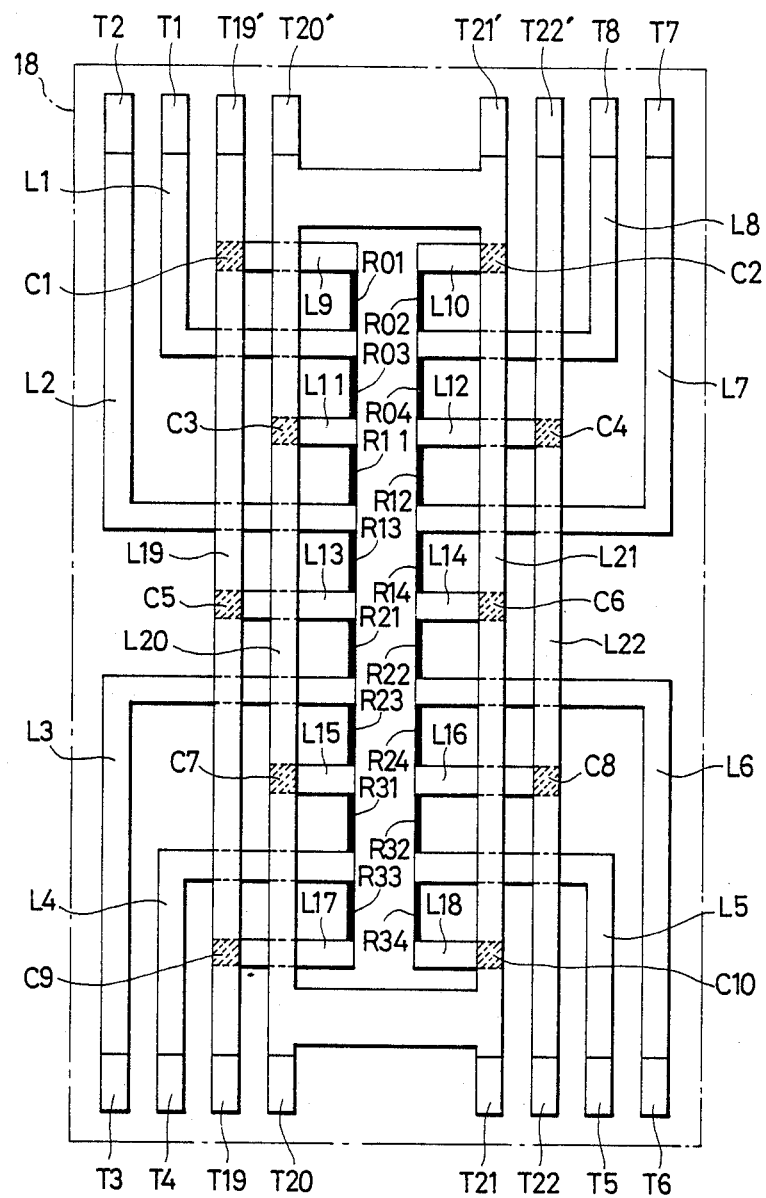
FIG. 13 is a schematic diagram showing the arrangement of the magnetoresistive elements and the connection of conductors on a magnetic sensor of a position detecting apparatus according to still another embodiment of the present invention.

FIG. 13 is a drawing showing the arrangement and connection of the magnetoresistive elements and the wiring according to a further embodiment of the present invention. In the figure, the same reference symbols denote the same parts as in the foregoing embodiments. The arrangement of the magnetoresistive elements R01 to R34 and the connection of the wiring conductors L1 to L22 in this embodiment are basically the same as in FIG. 7.

In the arrangement of FIG. 7, all the terminals T1 to T22 were arranged on the edge of one side of the base plate 18. On the contrary, the terminals are arranged on the edges of both sides of the base plate 18 in the arrangement of this embodiment. Namely, there are provided, on the edge of the upper side of the base plate 18, the terminals T1 and T8 associated with the elements R01 to R04 and the terminals T2 and T7 associated with the elements R11 to R14, and, on the edge of the lower side thereof, the terminals T3 and T6 associated with the elements R21 to R24 and the terminals T4 and T5 associated with the elements R31 to R34. The upper side of the base plate 18 is a most accessible side to the elements R01 to R04 and R11 to R14, and the lower side thereof is that to the elements R21 to R24 and R31 to R34. In other words, terminals are provided on the side of a magnetic sensor, which is most accessible to the magnetoresistive elements associated with the terminals. Further, the terminals T19 to T22 and T19' to T22' for voltage supply are arranged on both the sides of the base plate 18. With this structure, the width of the magnetic sensor 8 can be made smaller.

Figure 14:
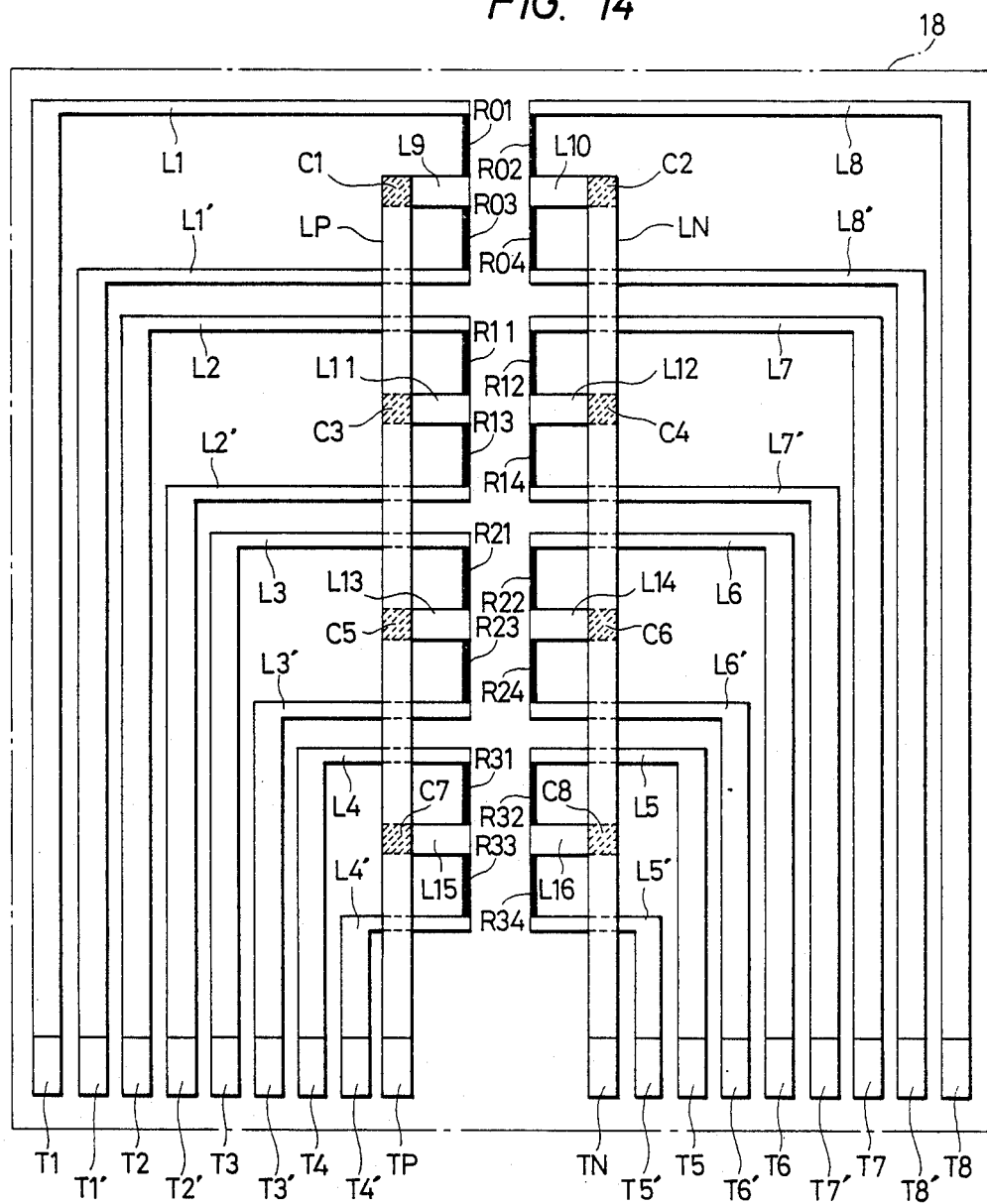
FIG. 14 schematically shows the arrangement of the magnetoresistive elements and the connection of conductors on a magnetic sensor of a position detecting apparatus according to a further embodiment of the present invention.

In all the embodiments described above, two among the magnetoresistive elements forming a certain bridge circuit, which are brought into a line on the base plate, are coupled with each other at the adjacent ends thereof and the coupling point serves as one of terminals for deriving the output voltage of the certain bridge circuit. Opposite ends of the elements are employed as terminals for voltage supply. However, the relationship of these terminals may be inverted. Namely, the bridge circuit is supplied with voltage at the coupling point of the elements and the output voltage can be derived from the opposite ends of the elements. FIG. 14 shows an embodiment of such a type. In the figure, the same reference symbols indicate the same parts as in the foregoing embodiments, and other reference symbols will be referred to in the following description of the structure and operation of this embodiment.

In this embodiment, the magnetoresistive elements are formed for every channels separately. As shown in the figure, the elements R01 and R03, which belong to the first set of the magnetoresistive elements, are formed as one body on the base plate 18, and the coupling point thereof is connected to the conductor L9. The conductor L9 is connected to a conductor LP at the coupling point C1. The conductor LP is connected to a terminal TP, to which the positive voltage of the source 16 is applied.

The elements R02 and R04, which belong to the second set of the magnetoresistive elements, are also formed as one body on the base plate 18, but by half the pitch ($\lambda/2$) apart form the first set of the elements R01 and R03. The coupling point thereof is connected to the conductor L10. At the coupling point C2, the conductor L10 is connected to a conductor LN, to which the negative voltage of the source 16 is applied through a terminal TN.

The respective ends of the elements R01 to R04 opposite to the coupled ends are connected to terminals T1, T8, T1' and T8' through conductors L1, L8, L1' and L8' The terminals T1 and T8', and T1' and T8 are externally connected with each other respectively to form two output terminals of a bridge circuit B0 corresponding to the channel CH0. It is to be noted that the bridge circuit B0 in this case is so modified that the element R03 in the bridge circuit B0 shown in FIG. 4 changes place with the element R04. However, it is operationally the same as the bridge circuit B0 of FIG. 4. As will be understood from the figure, the remaining bridge circuits B1, B2 and B3 corresponding to the channels CH1, CH2 and CH3 are constructed in the same manner. Although the connection of the wiring shown in FIG. 14 has the disadvantage of the increased number of terminals, it becomes simple in the arrangement of the conductors, compared with the foregoing embodiments.

Further, it is to be noted that, through all of the embodiments mentioned above, the terminals associated with the conductors for deriving the output voltages from the magnetoresistive elements are so arranged on the base plate of the magnetic sensor that the terminals corresponding to the channel which is most remote from the side on which the terminals are provided, are positioned as the outermost terminals. Thereby, there are no crossing points of the conductors and therefore the mutual interference by the output voltages between the channels can be decreased.

In the description mentioned above, the position detector is formed by the rotary drum with the magnetic signals recorded thereon and the sensor for detecting the magnetic signals recorded on the drum, whereby the position of a rotating body can be detected. However, the present invention can be also applied to a position detector, in which the rotary drum is substituted by a linearly moving member, on which the magnetic signals of the pattern as shown in FIG. 2 are recorded. With such a position detector, the position of a linearly moving body can be detected directly without converting the linear movement into the rotating one.

Although here are shown only the limited number of forms of apparatus embodying the present invention, it is understood that various changes and modifications may be made therein within the scope of the appended claims without departing from the spirit and scope of the present invention.

We claim:

1. An apparatus for magnetically detecting the position of a movable body, comprising:
   a magnetic recording medium provided on one of a moving part coupled to the movable body for movement therewith and a fixed part facing the moving part, the magnetic recording medium having a recording portion divided into a plurality of channels extending in the direction of movement of the moving part, each of the channels including a pair of tracks having magnetic signals recorded thereon at predetermined intervals so that the magnetic signals on one of the pair of tracks are shifted by a distance equal to the predetermined interval from the magnetic signals recorded on the other of the pair of tracks;
   a magnetic sensor provided on the other of the moving part and the fixed part and having magneto resistive elements arranged to face the channels of the magnetic recording medium with a predetermined air gap therebetween so as to detect the magnetic signals recorded on the corresponding channels, the magnetic sensor providing an output signal indicative of the position of the movable body;

the magnetic sensor further including a base plate of insulating material having magnetoresistive elements arranged thereon so that the magnetoresistive elements facing each channel include a first set of two magnetoresistive elements and a second set of two magnetoresistive elements, a first element of the first set of two magnetoresistive elements being disposed for facing one of the pair of tracks of a respective channel and the second element of the first set of two magnetoresistive elements being disposed for facing the other of the pair of tracks of the respective channel, a first element of the second set of two magneto resistive elements being disposed for facing the one track of the pair of tracks of the respective channel at a position spaced by a predetermined distance from the first element of the first set of the magnetoresistive elements, the second element of the second set of two magnetoresistive elements being disposed for facing the other of the pair of tracks of the respective channel at a position spaced by the predetermined distance from the second element of the first set of the magnetoresistive elements;

the first and second elements of the first and second sets of two magnetoresistive elements being connected as a bridge circuit for producing an output signal in accordance with the magnetic signals recorded on the respective channel; and the first and second elements of the first and second sets of the magnetoresistive elements being formed as one body on the base plate so that the first and second elements of the first and second sets of the magnetoresistive elements are coupled with each other at adjacent ends thereof, the coupled adjacent ends of the first and second sets of the magnetoresistive elements being connected to one of a first group of terminals provided on an edge of the base plate of the magnetic sensor for connecting the magnetoresistive elements with an external circuit for supplying the magnetoresistive elements with source voltage and a second group of terminals for deriving output voltages from the bridge circuit connected magnetoresistive elements, and nonadjacent ends of the first and second elements of the first and second sets of magnetoresistive elements which are opposite to the coupled ends of the magnetoresistive elements being connected to the other of the first and second group of terminals.

2. An apparatus for magnetically detecting the position of a movable body as defined in claim 1, wherein the coupled adjacent ends of the first and the second sets of the magnetoresistive elements are connected to the second group of terminals for deriving the output voltages from the magnetoresistive elements and the nonadjacent ends are led to the first group of terminals for supplying the magnetoresistive elements with the source voltage.

3. An apparatus for magnetically detecting the position of a movable body as defined in claim 2, wherein the nonadjacent end of the first element of the first set of the magnetoresistive elements corresponding to a certain channel is coupled in common with the nonadjacent end of the second element of the first set of the magnetoresistive elements corresponding to a channel adjacent to the certain channel to one of the polarities of the source voltage, the nonadjacent end of the first element of the second set of the magnetoresistive elements of the certain channel is coupled in common with the nonadjacent end of the second element of the second set of the magnetoresistive elements of the adjacent channel to the other polarity of the source voltage, the nonadjacent end of the second element of the first set of the magnetoresistive elements of the certain channel is coupled in common with the nonadjacent end of the first set of the magnetoresistive elements of the adjacent channel to the other polarity of the source voltage, and the nonadjacent end of the second element of the second set of the magnetoresistive elements of the certain channel is coupled in common with the nonadjacent end of the first element of the second set of the magnetoresistive elements of the adjacent channel to the one polarity of the source voltage.

4. An apparatus for magnetically detecting the position of a movable body as defined in claim 2, wherein conductors for supplying the magnetoresistive elements with the source voltage and the terminals associated therewith are arranged inside conductors for deriving the output voltages from the magnetoresistive elements and the terminals associated therewith, when viewed from the side of the magnetoresistive elements.

5. An apparatus for magnetically detecting the position of a movable body as defined in claim 2, wherein conductors for supplying the magnetoresistive elements with the source voltage are formed to be lower in electrical resistance than conductors for deriving the output voltages from the magnetoresistive elements.

6. An apparatus for magnetically detecting the position of a movable body as defined in claim 2, wherein the terminals associated with conductors for supplying the magnetoresistive elements with the source voltage are so arranged on one side of the magnetic sensor that the terminals to be applied by one of the polarities of the source voltage and the terminals to be applied by the other polarity alternate regularly.

7. An apparatus for magnetically detecting the position of a movable body as defined in claim 2, wherein conductors for supplying the magnetoresistive elements with the source voltage and the terminals associated therewith are arranged outside conductors for deriving the output voltages from the magnetoresistive elements and the terminals associated therewith, when viewed from the side of the magnetoresistive elements.

8. An apparatus for magnetically detecting the position of a movable body as defined in claim 2, wherein the terminals associated with one half of the bridge circuits is arranged on one side of the magnetic sensor, which is most accessible to the one half of the bridge circuits, and the terminals associated with the other half of the bridge circuits are arranged on the other side, which is most accessible to the other half of the bridge circuits.

9. An apparatus for magnetically detecting the position of a movable body as defined in claim 1, wherein the coupled adjacent ends of the first and the second sets of the magnetoresistive elements are connected to the first group of terminals for supplying the magnetoresistive elements with the source voltage and the nonadjacent ends are led to the second group of terminals respectively and connected in the external circuit to make the magnetoresistive elements form the bridge circuits.

10. An apparatus for magnetically detecting the position of a movable body as defined in claim 1, wherein the second group of terminals are associated with conductors for deriving the output voltage from the magnetoresistive elements and are arranged on the base plate of the magnetic sensor in such a manner that the terminals corresponding to the channel, which is most remote from the side of the base plate on which the terminals are provided, are positioned as the outermost terminals when viewed from the side of the magnetoresistive elements.

11. An apparatus for magnetically detecting the position of a movable body as defined in claim 1, wherein the magnetoresistive elements are formed on the base plate by the vapor deposition of magnetic material and conductors are formed on the base plate by the vapor deposition of conductive material for connecting the magnetoresistive elements and the terminals.

12. An apparatus for magnetically detecting the position of a movable body as defined in claim 11, wherein the conductors for deriving the output voltages from the magnetoresistive elements are arranged on a first wiring layer on which the magnetoresistive elements are formed, and the conductors for supplying the magnetoresistive elements with the source voltage are arranged on a second wiring layer which is formed on the first wiring layer through an insulating layer.

13. An apparatus for magnetically detecting the position of a movable body as defined in claim 11, wherein there is formed on the base plate by the vapor deposition of magnetic material a magnetoresistive element body, which includes a slender portion, lead portions projected from the slender portion at the predetermined interval, and terminal portions provided at respective ends of the lead portions to which the conductors are connected, whereby the slender portion is functionally divided into plural segments, each of which serves as the magnetoresistive element.

14. An apparatus for magnetically detecting the position of a movable body as defined in claim 13, wherein the terminal portions are extended to function as a part of the conductors.

* * * * *